US009817307B2

(12) United States Patent
Yu et al.

(10) Patent No.: US 9,817,307 B2
(45) Date of Patent: Nov. 14, 2017

(54) METHOD OF MANUFACTURING AN EXTREME ULTRAVIOLET (EUV) MASK AND THE MASK MANUFACTURED THEREFROM

(71) Applicant: TAIWAN SEMICONDUCTOR MANUFACTURING CO., LTD., Hsinchu (TW)

(72) Inventors: Chia-Hao Yu, Hsinchu (TW); Ming-Yun Chen, Hsinchu (CN)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 106 days.

(21) Appl. No.: 15/010,856

(22) Filed: Jan. 29, 2016

(65) Prior Publication Data
US 2016/0161838 A1    Jun. 9, 2016

Related U.S. Application Data

(63) Continuation of application No. 14/019,809, filed on Sep. 6, 2013, now Pat. No. 9,250,513.

(51) Int. Cl.
| G03F 1/22 | (2012.01) |
| G03F 1/72 | (2012.01) |
| G03F 1/24 | (2012.01) |
| G03F 1/76 | (2012.01) |
| G03F 1/80 | (2012.01) |

(52) U.S. Cl.
CPC .............. *G03F 1/24* (2013.01); *G03F 1/22* (2013.01); *G03F 1/72* (2013.01); *G03F 1/76* (2013.01); *G03F 1/80* (2013.01)

(58) Field of Classification Search
None
See application file for complete search history.

(56) References Cited

U.S. PATENT DOCUMENTS

| 6,821,682 | B1 | 11/2004 | Stearns et al. |
| 6,967,168 | B2 | 11/2005 | Stearns et al. |
| 2006/0234135 | A1 | 10/2006 | Hau-Riege et al. |
| 2014/0065521 | A1 | 3/2014 | Lu et al. |
| 2014/0186751 | A1 | 7/2014 | Yu et al. |

*Primary Examiner* — Stephen Rosasco
(74) *Attorney, Agent, or Firm* — Maschoff Brennan

(57) ABSTRACT

Any defects in the reflective multilayer coating or absorber layer of an EUV mask are problematic in transferring a pattern of the EUV mask to a wafer since they produce errors in integrated circuit patterns on the wafer. In this regard, a method of manufacturing an EUV mask is provided according to various embodiments of the present disclosure. To repair the defect, a columnar reflector, which acts as a Bragg reflector, is deposited according to various embodiments so as to locally compensate and repair the defect. According to the embodiments of the present disclosure, the reflective loss due to the defect can be compensated and recover the phase different due to the defect from, so as to form a desirable wafer printed image.

20 Claims, 12 Drawing Sheets

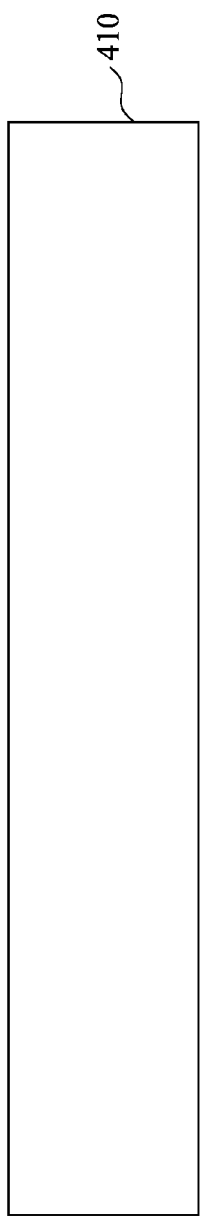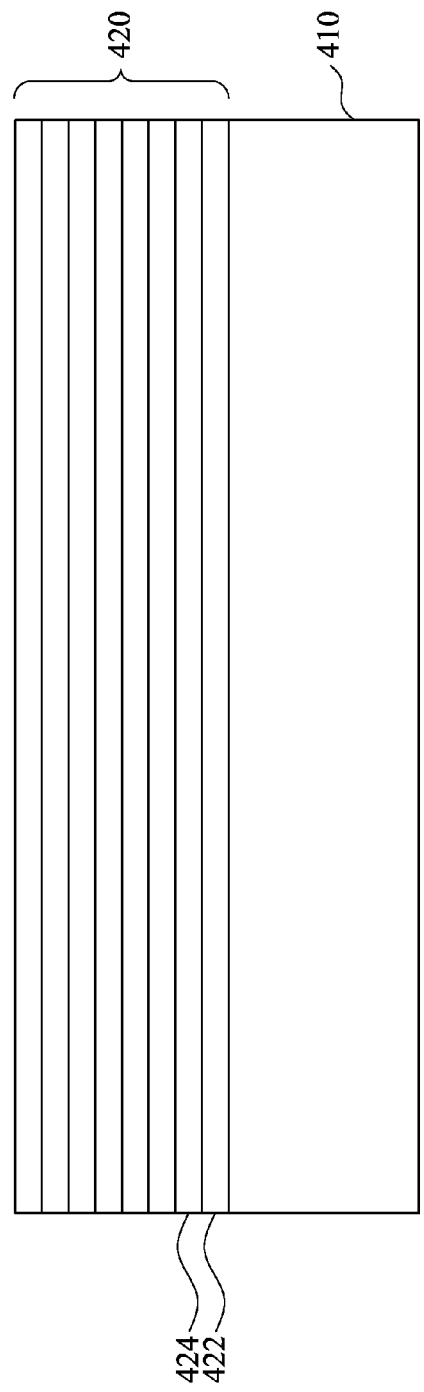

METHOD OF MANUFACTURING AN EXTREME ULTRAVIOLET (EUV) MASK AND THE MASK MANUFACTURED THEREFROM

PRIORITY CLAIM AND CROSS-REFERENCE

The present application is a continuation-in-part application of U.S. application Ser. No. 14/019,809 filed on Sep. 6, 2013. The entire disclosures of the above applications are hereby incorporated by reference herein.

BACKGROUND

Semiconductor devices have been more and more miniaturized. The semiconductor devices are mass-produced by repeatedly applying a photolithography process to form different layers of material. In a photolithography process, a photomask having a pattern is irradiated with light to transfer the pattern onto a photosensitive coating on a semiconductor substrate (hereinafter, referred to as "wafer") via a reduction optical system. To improve photolithography resolution so smaller features can be patterned, the exposure wavelength of optical lithography have been shortened. In recent years, photolithography that uses extreme ultraviolet (EUV) light (wavelength=13.5 nm) having a much shorter wavelength has been in development. However, at short wavelengths for EUV lithography, the electromagnetic radiation is absorbed by most materials, including glass used for conventional lenses and masks. Therefore a completely different tool is necessary for performing EUV lithography compared to conventional photolithography.

Some EUV lithography tools employ reflection type photomasks. A reflective EUV lithography mask (hereinafter, referred to as EUV mask) is composed of a reflective multilayer (ML) coating of alternatively stacked films of, for example, molybdenum (Mo) films and silicon (Si) films. The films are deposited on low thermal expansion material (LTEM) such as a quartz substrate or low-thermal-expansion glass substrate. An absorber pattern is formed on the reflective ML coating. The multilayer film is a thin film mirror that reflects light through constructive interference.

Because of the extremely short exposure wavelength of 13.5 nm, a small perturbation in the surface of the dielectric mirror can cause a phase defect in the reflection that can blur the pattern transferred onto a wafer. Some phase defects are caused by pits created during substrate polishing. Some phase defects are caused by particles on a substrate that are not removed by cleaning. Improvements in structures of and methods of forming EUV masks that reflect with little or no phase defects continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A-E are schematic cross-sectional views at various stages of fabricating an EUV mask according to various embodiments of the present disclosure.

DETAILED DESCRIPTION

Figure 1:
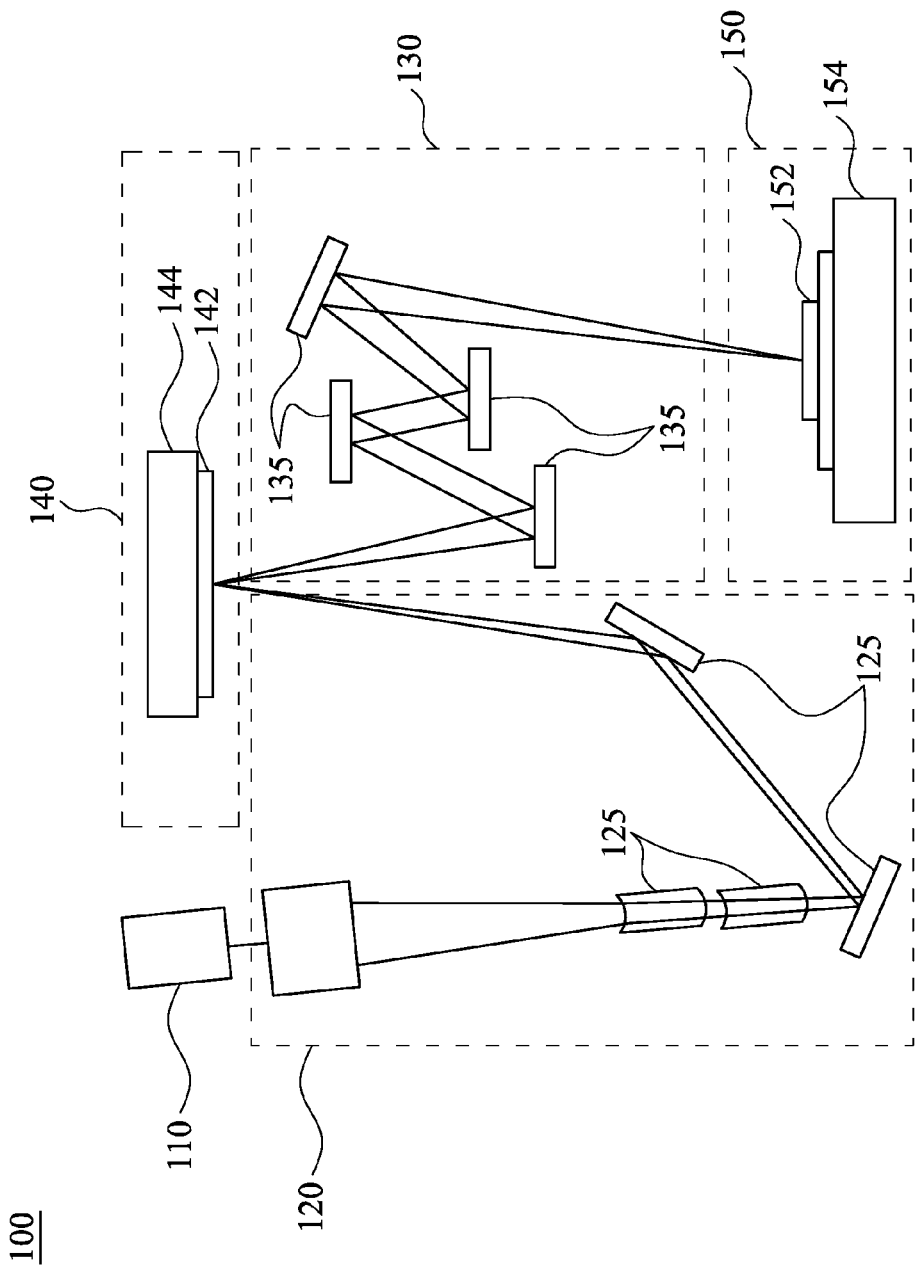
FIG. 1 is a block diagram of a photolithography imaging system that uses a mask in processing a wafer.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a gate stack includes embodiments having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

An EUV mask composes of an absorber pattern layer and multiple layers of molybdenum and silicon to create the reflective type mask. The defects causing EUV phase shift are buried in reflective multilayer coating or on the substrate. Any defects in the reflective multilayer coating or the substrate of the EUV mask are problematic in transferring a pattern of the EUV mask to a wafer since they produce errors in integrated circuit patterns on the wafer. The phase defect changes the reflection angle and alters the thicknesses of the reflective layers, resulting in the reflection shifting from a designed maximum reflection. As result, the phase defect can reduce the intensity of the reflected EUV radiation, and shift the phase of the EUV radiation. As such, unexposed photoresist becomes residues, which deteriorates a desired wafer image for printing.

In order to compensate the EUV phase defect, a columnar reflector, which acts as a Bragg reflector, is deposited according to various embodiments to locally compensate and repair the EUV phase defect. According to the embodiments of the present disclosure, the reflective loss due to the EUV phase defect can be compensated and phase shift recovered, so as to reduce the deleterious effects of the defect on the wafer printed image.

In FIG. 1, an EUV lithography imaging system 100 transfers a pattern of an EUV mask to a wafer. The system 100 includes a radiation source 110, a condenser optics section 120, a projection optics section 130, a mask stage 140, and a wafer stage 150. The radiation source 110 may be any source able to produce radiation in the EUV wavelength range. One example of a suitable radiation source 110 is a plasma created when a laser illuminates a gas, such as a supersonic jet of xenon gas. As another example, a suitable radiation source 110 may be formed using bending magnets and undulators associated with synchrotrons. As a further example, a suitable radiation source 110 may be formed or developed from discharge sources, which have the potential to provide adequate power in the desired wavelength range. EUV radiation is strongly absorbed in virtually all transmissive materials, including gases and glasses. To minimize unwanted absorption, EUV imaging is carried out in near vacuum.

The mask stage 140 includes a transport stage 144 that scans a mask 142. In the EUV lithography imaging system 100, the mask 142 is reflective because EUV radiation is strongly absorbed in most materials such as transmissive photomasks that are used in traditional photolithography imaging systems.

The projection optics section 130 reduces the image from the mask 140 in the mask stage 140 and forms the image onto wafer 152 in the wafer stage 150. In the EUV lithography imaging system 100, the projection optics is reflective because of the absorption associated with EUV radiation. Accordingly, the projection optics section 130 includes reflectors or mirrors 135 that project radiation reflected from the mask 140 onto the wafer. The reflectance spectrum of the mask 142 may be matched to that of the mirrors in the projection optics section 130. The term "projection optics" used herein should be broadly interpreted as encompassing any type of projection system, including refractive, reflective, catadioptric, magnetic, electromagnetic and electrostatic optical systems, or any combination thereof, as appropriate for the exposure radiation being used.

The wafer stage 150 includes a transport stage 156 that scans a semiconductor wafer 152 in synchrony with the mask 142 and steps the wafer 152 into a position to accept a next image from the mask 142. During operation, a semiconductor wafer 152 mounted to the transport stage 154. The projection optics imparts the radiation light with a pattern in its cross-section to create a pattern in a target portion of the wafer 152. It should be noted that the pattern imparted to the radiation light may not exactly correspond to the desired pattern in the target portion of the wafer, for example if the pattern includes phase-shifting features or shadows. Generally, the pattern imparted to the radiation light will correspond to a particular functional layer in a device being created in a target portion of the wafer 152, such as an IC.

Figure 2:
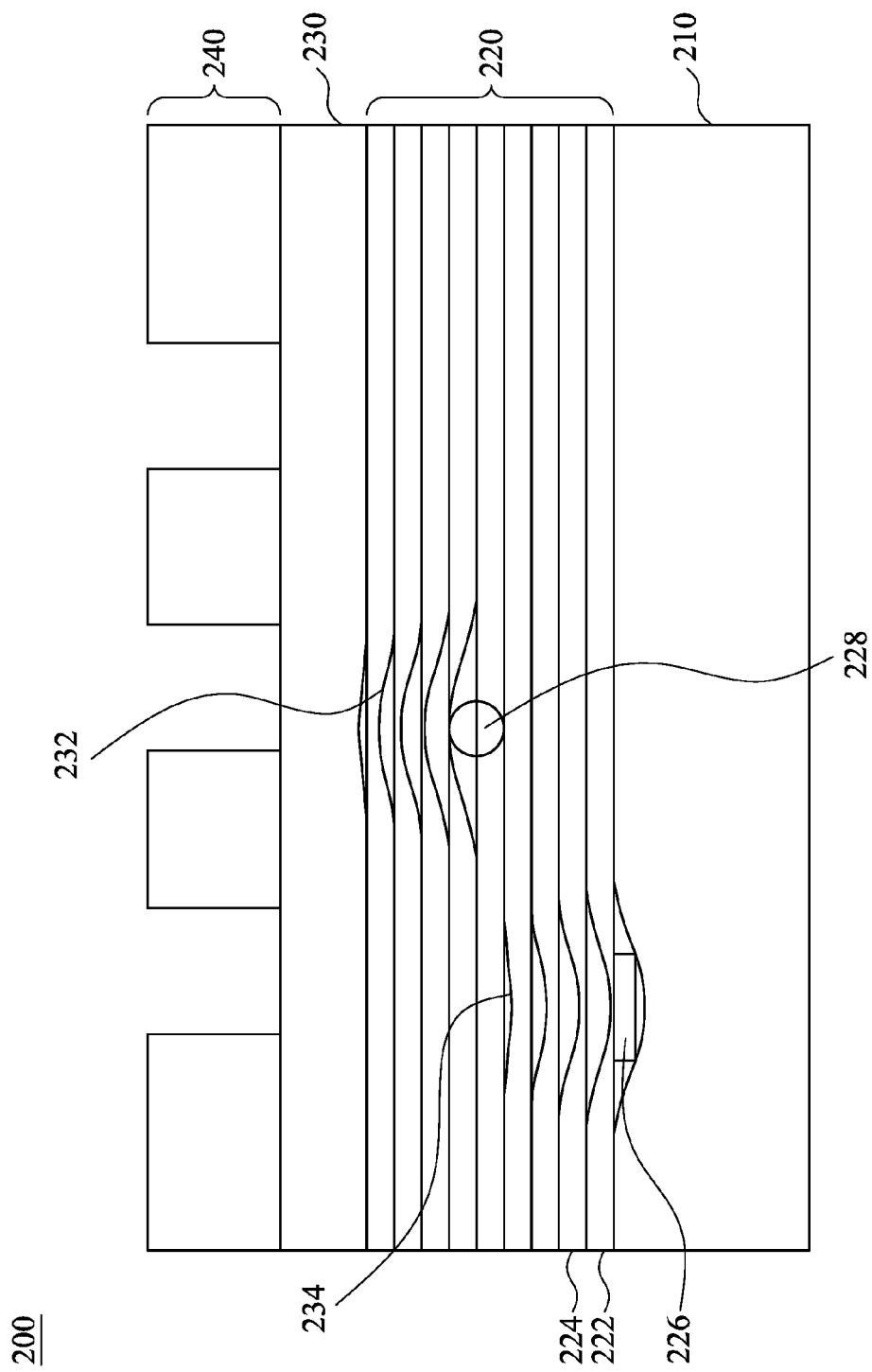
FIG. 2 is a schematic cross-sectional view of an EUV mask in the existence of defects.

FIG. 2 is a schematic cross-sectional view of an EUV mask 200 with defects. The EUV mask 200 includes a substrate 210, a reflective multiplayer (ML) film 220, a buffer or capping layer 230, and a patterned absorber layer 240. In general, the reflective ML film 220 consists of 40 pairs of molybdenum (Mo) layer 222 and amorphous silicon (Si) layer 224. The thicknesses of the individual layer of the reflective ML film 220 are about 3 and 4 nm for the Mo and Si, respectively. The reflectivity is a resonant property of the reflective ML coating 220, such that the fields reflected by every pair of layers interfere constructively and add to the total reflection. The reflection occurs through the depth of the film, and any deformation or disruption of the layer structure within the reflective ML film 220 can become a defect.

Two types of defects that commonly occur in a EUV mask are shown in FIG. 2. Defect 228 is formed in a reflective multiplayer (ML) film 220 and defect 226 occurs at a substrate 210, which exhibits in form 232 of a protruded shape (bump) and in form 234 of a recessed shape (pit), respectively. The form 232 of the defects denotes a protruded defect 232 or a recessed defect 234.

In the case of the protruded defect, the surface of the reflective ML film 220 in FIG. 2 is partially bulged. An extrinsic defect is a deformation or disruptions of the reflective ML film 220 and the substrate 210 derive from an external perturbation, for example, defect 228. The defects may be a particle imbedded in the reflective ML film 220 and the substrate 210 during the deposition process, or a particle, pit or scratch imbedded on the top of the coating after deposition. The effect of the defect on the reflected field will depend on where the defect is derived. When the nucleation occurs at the substrate 210, or in the bottom part of the reflective ML film 220, then the film growth dynamics will tend to damp out the structural perturbation. The defect may also be derived near or at the top of the reflective ML film 220. This could be a particle introduced during the deposition of the top layers, or a particle, pit or scratch imbedded in the top surface subsequent to the deposition. The particle and the damaged part of the reflective ML film will shadow the underlying layers and thereby attenuate the reflected field.

Defects that are categorized into an intrinsic type may occur in the EUV mask. The intrinsic defect is derived from the statistical fluctuations that are characteristic of the vapor deposition process that is used to deposit the reflective ML film 220. In particular, shot noise in the atom-by-atom deposition process leads to the accumulation of random roughness. The variance of the roughness scales fairly linearly with the total thickness of the reflective ML film 220. The lower frequency components of the roughness are replicated by overlying layers and thereby propagate up towards the top of the coating. When one of these random thickness fluctuations exceeds a critical size that is approximately 0.5 nm in height and 100 nm in width, it becomes an intrinsic defect. The resulting deformation of the layer structure produces an unacceptable perturbation in the phase of the reflected field. Either the extrinsic- or intrinsic-type defects produce a modulation of the phase of the reflected field, and thus are both considered as phase defects.

Figure 3A:
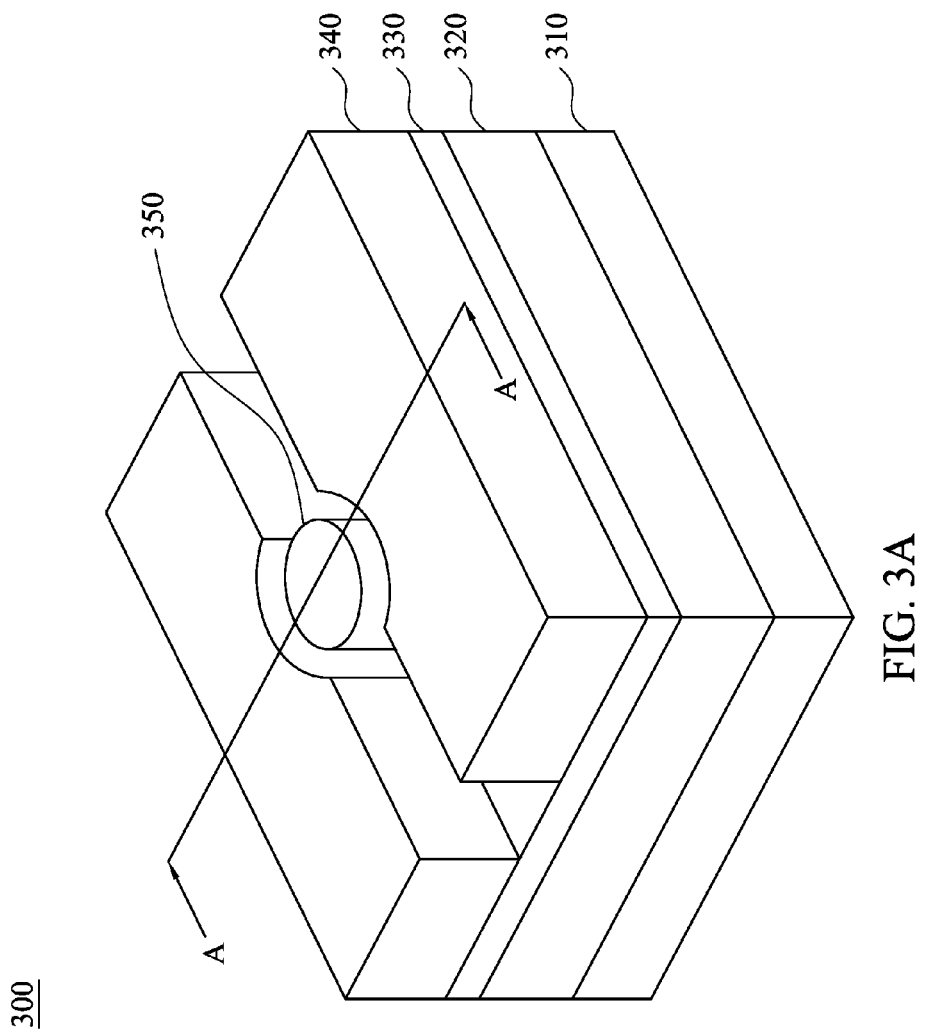
FIG. 3A is prospective view schematically illustrating an EUV mask having a columnar reflector thereon according to various embodiments of the present disclosure.

FIG. 3A is prospective view schematically illustrating an EUV mask having a columnar reflector 350 according to various embodiments of the present disclosure. The EUV mask includes a substrate 310, a reflective multilayer (ML) coating 320 for reflecting EUV light, a buffer layer 330, an absorber pattern 340, and a columnar reflector 350. According to embodiments of the present disclosure, the absorber pattern 340 has features which may expose a top surface of the reflective ML coating 320, or the buffer layer 330 and the columnar 350 is located on the top surface of the reflective ML coating exposed from the portion of the absorber pattern.

Figure 3B:
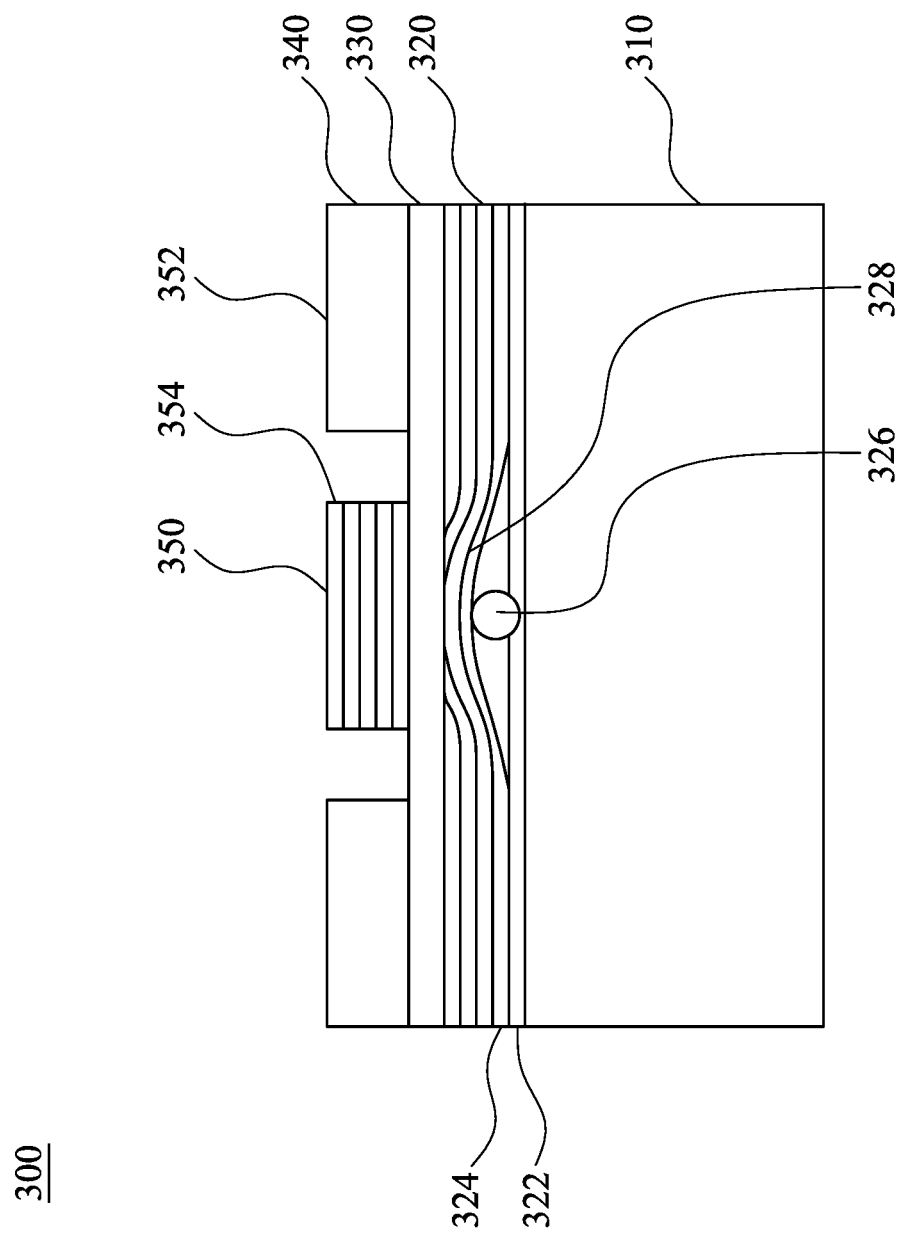
FIG. 3B is a schematic cross-sectional view of the EUV mask of FIG. 3A along line AA.

FIG. 3B is a schematic cross-sectional view of the EUV mask of FIG. 3A along line AA. According to various embodiments, the reflective ML coating 320 consists of pairs of molybdenum (Mo) layer 222 and amorphous silicon (Si) layer 324. The thickness of the individual layer of the reflective ML coating 320 are about 3 and 4 nm for the Mo and Si, respectively. The reflectivity is a resonant property of the reflective Ml coating 320, such that the fields reflected by every pair of layers interfere constructively. The reflectivity occurs through the depth of the film, and any deformation or disruption of the layer structure within the reflective coating can become a defect. A defect particle 326 is embedded in the reflective ML film 320 exhibiting in form 328 of a protruded shape. The surface of the reflective ML coating 320 over the defect particle 326 in FIG. 3B may be partially bulged. In some embodiments, the bulged part from the reflective ML coating 320 is leveled prior to the formation of the buffer layer 320 and the columnar reflector 350. In some embodiments, the buffer layer 330 acts as a capping layer that is protective to the underlying reflective ML coating 320.

Figure 3C:
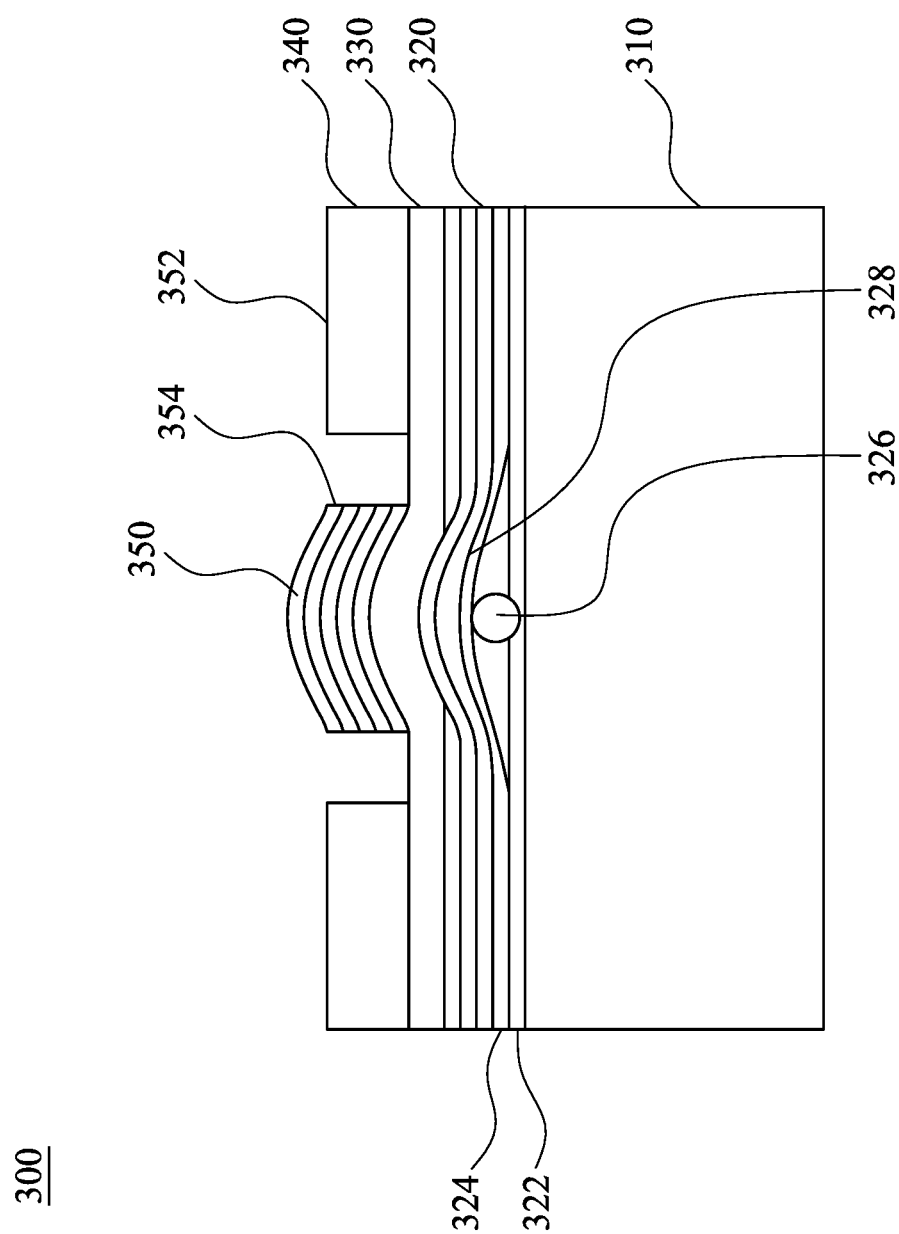
FIG. 3C is a schematic cross-sectional view of the EUV mask according to alternative embodiments of FIG. 3B.
Figure 3D:
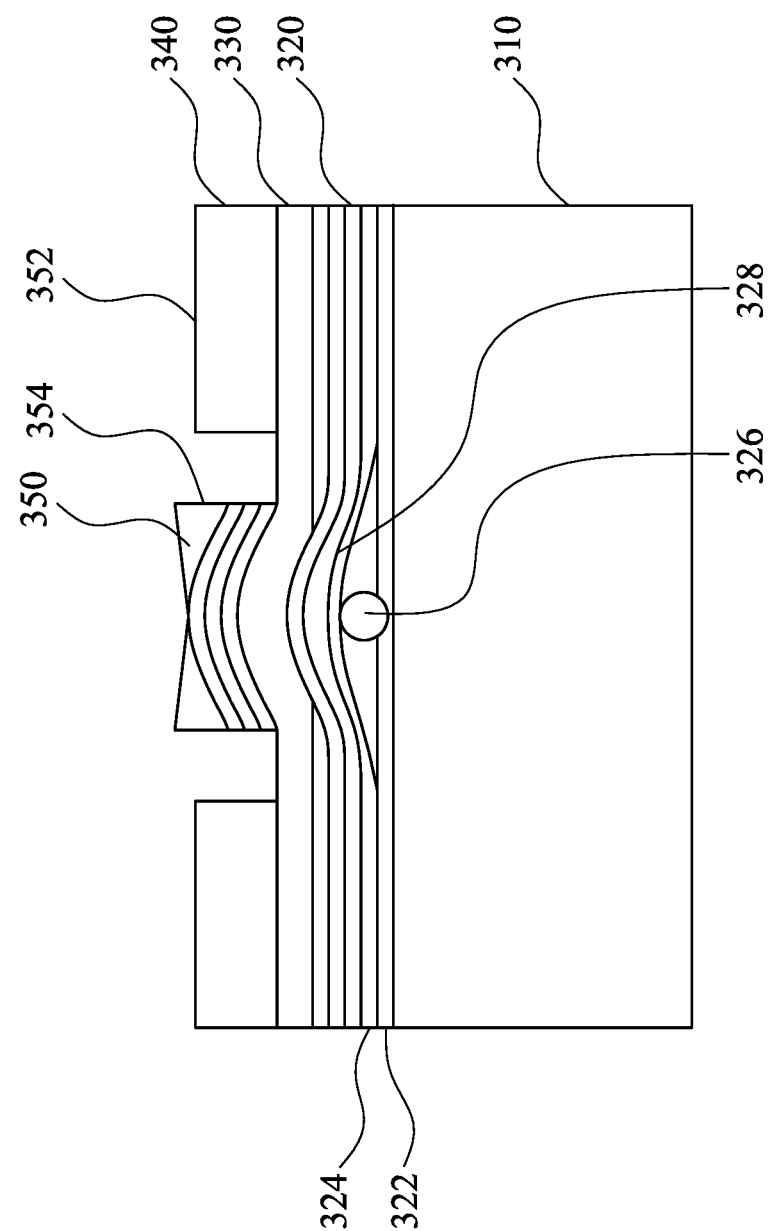
FIG. 3D is a schematic cross-sectional view of the EUV mask according to alternative embodiments of FIG. 3B.

The profile of deposited film may have an influence on the performance of reflected light. FIG. 3C is a schematic cross-sectional view of the EUV mask according to alternative embodiments of FIG. 3B. In various embodiments, because the buffer layer 330 is protruded with the defect form 328, the subsequently-deposited columnar reflector 350 may has a Gaussian or curving shape along the surface of the buffer layer 330. Alternatively, referring to FIG. 3D, the columnar reflector 350, which has a top surface in V-shape, may be deposited on the protruded surface of the buffer layer 330 and the defect form 328. In some embodiments, the top surface may be in arbitrary form as long as in favor of the performances of the reflected light. According to various embodiments of the present disclosure, the columnar reflector 350 has a cross-sectional area substantially equal to the form 328 of the shift defect in the reflective ML coating 320 underneath the columnar reflector 350. In various embodiments, the cross-section area of the columnar reflector 350 is arbitrary such as in a Gaussian, rectangle, square, circular, polygonal or curving shape. In some embodiments, the columnar reflector 350 is not in contact with a sidewall of the absorber pattern 340.

According to various embodiments of the present disclosure, the columnar reflector 350 has one or more stack of alternating layers of a high index of refraction material 352 and a low index of refraction material 354. In some embodiments, the columnar reflector 350 has one or more stack of alternating layers of three layers of two low index of refraction material 354 and one high index of refraction material 352 or one low index of refraction material 354 and two high index of refraction material 352. In certain embodiments, the low index of the refraction material 354 is Si, TEOS, B4C, $SiO_2$, Y, or SiC, and the high index of the refraction material 352 is Mo, $MoO_2$, Cr, W, La, Mg, Ru, or TaBN. In an embodiment, the low index of refraction material 352 is TEOS and the high refractive index of the material 354 is Cr.

Figure 4C:
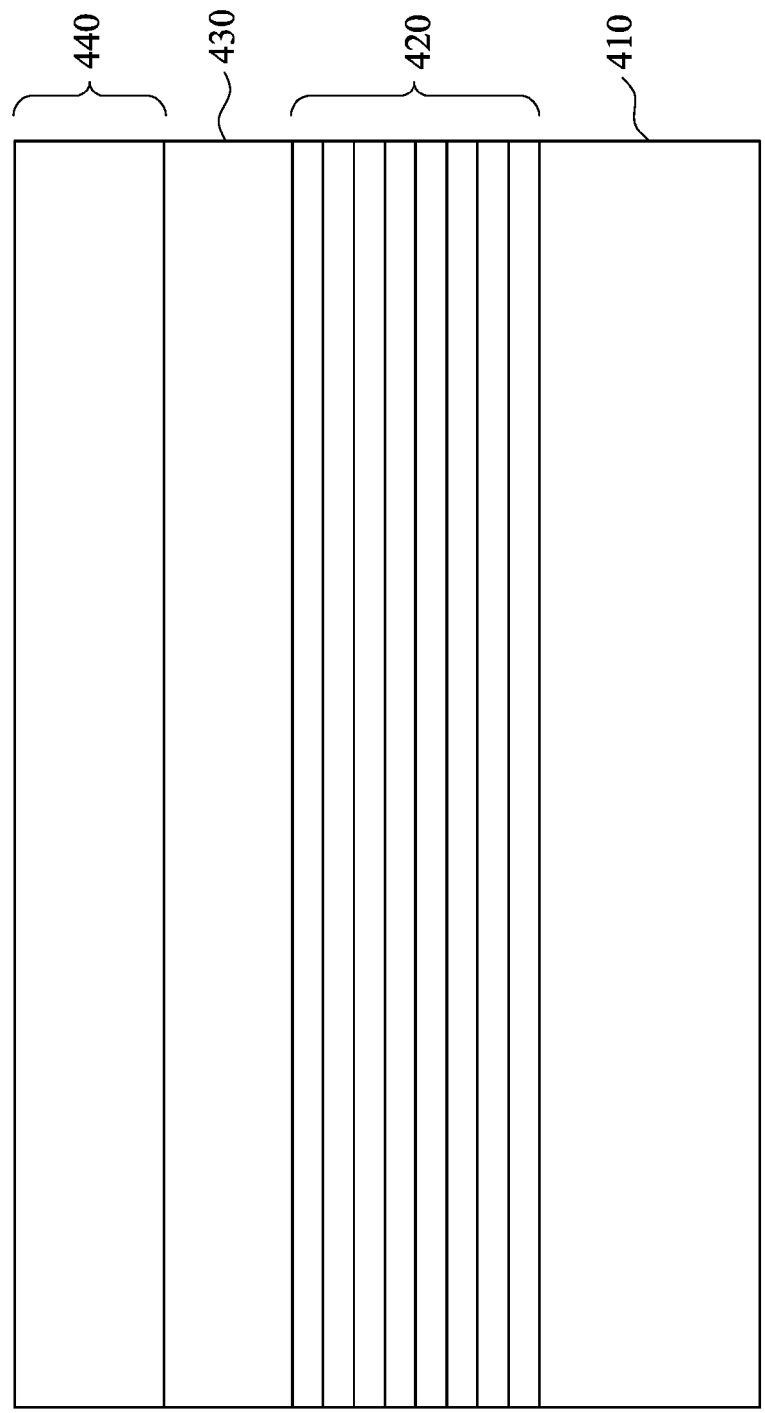
Figure 4D:
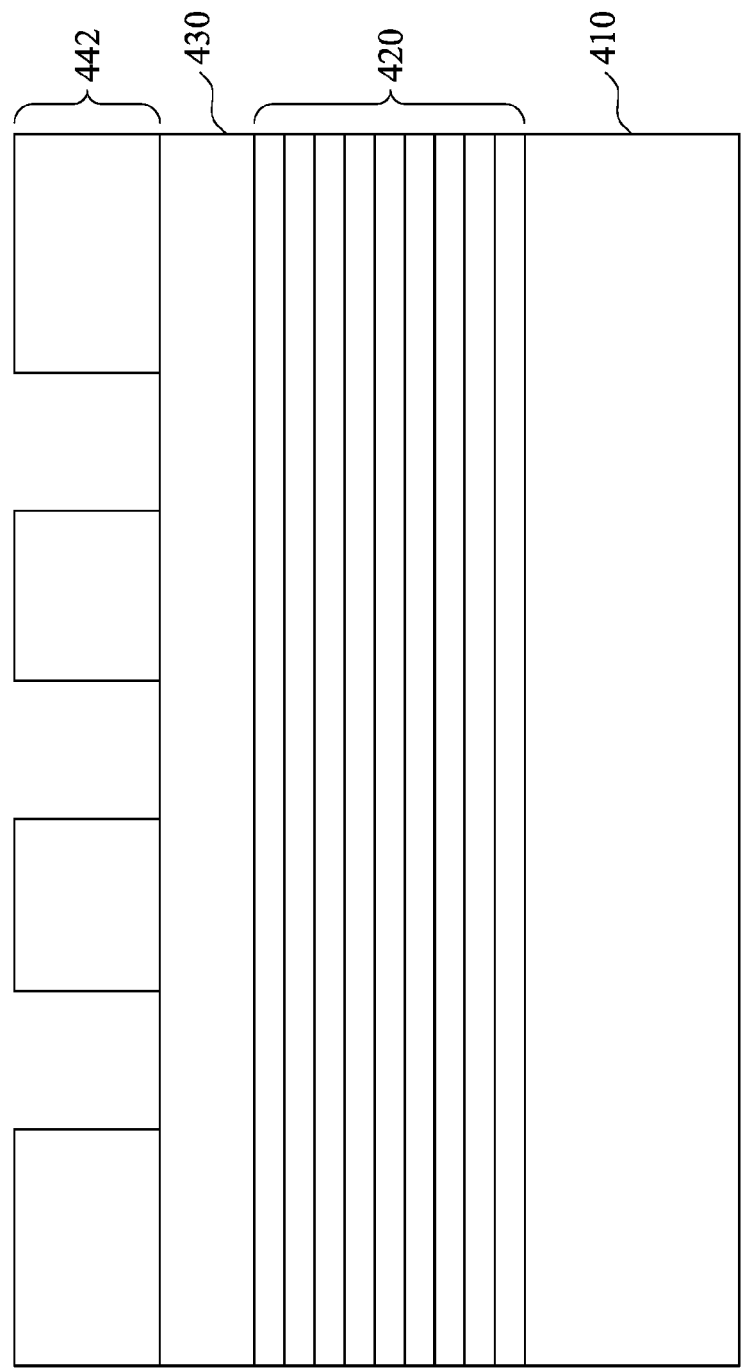
Figure 4E:
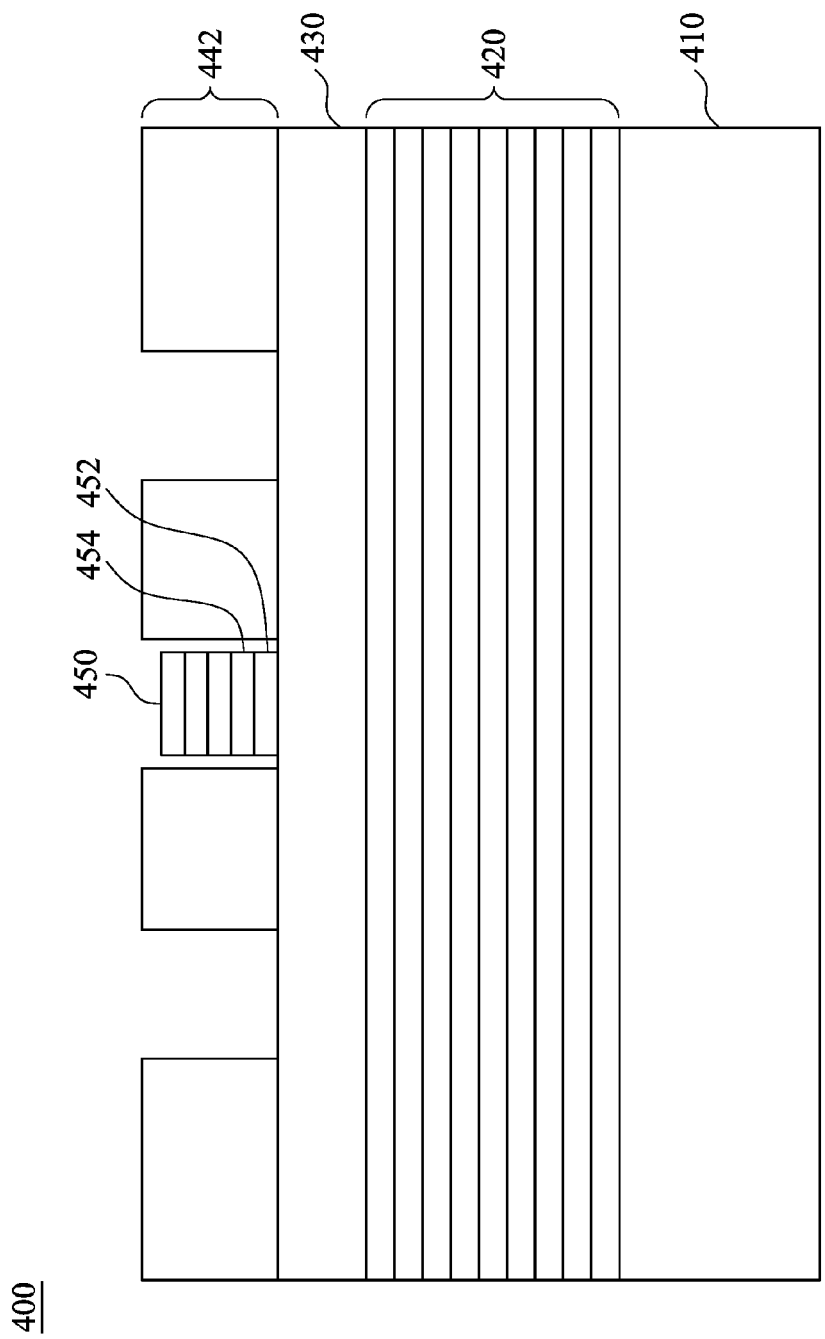

As shown in FIG. 4E, there exist a gap d between the columnar reflector 450 and the absorber pattern 442. In various embodiments, the gap d may be intentionally introduced to increase the intensity of reflected light by revealing more normal reflective multilayer surfaces; that is, the surfaces have no defects underneath. Basically, the dimension of the gap d has to be large enough to guarantee the critical dimension (CD) error of post-repair features/regions within −/+10% variation of a layout designed target.

During the EUV lithography process, up to about 40% of the EUV light is absorbed by the EUV mask. Thermal expansion caused by the heating leads to a large image distortion that may exceed the error tolerance. Low thermal expansion material (LTEM) has been used as the substrate material for the substrate of the EUV masks. Accordingly, the substrate 310 may has a low thermal expansion coefficient (for example, the thermal expansion coefficient within a temperature range of from 19° C. to 27° C. is $0\pm1.0\times10^{-7}/°$ C. In various embodiments, the thermal expansion coefficient is $0\pm0.3\times10^{-7}/°$ C., $0\pm0.2\times10^{-7}/°$ C., $0\pm0.1\times10^{-7}/°$ C., or $0\pm0.05\times10^{-7}/°$ C. As the substrate 310, a glass having a low thermal expansion coefficient, such as a β quartz may be used, but the substrate is not so limited.

The reflective ML coating 320 of the EUV mask has a high EUV light reflectance. The selection of materials in the reflective ML coating 320 depends on the radiation wavelength (λ), in which each layer has a thickness of approximately one quarter of λ. In particular, the thickness of the respective layers of the reflective ML coating 320 depends on the radiation wavelength λ, and the incidence angle of the radiation light. For EUV, the λ is 13.5 nm and the incidence angle is about 5-6 degrees. The maximum reflectance to light having a wavelength in the vicinity of 13.5 nm is at least 60%. The thicknesses of the alternating layers are tuned to maximize the constructive interference of the EUV light reflected at each interface and to minimize the overall absorption of the EUV light. The reflective ML coating 320 can achieve about 60-75% reflectivity at the peak radiation wavelength. In various embodiments, the reflective ML coating 320 has about 30 pairs to 60 pairs of alternating layers of a high index of refraction material 322 and a low index of refraction material 324. For example, 40 pairs of the alternative layers 322/324 of the reflective ML coating 320 are deposited in which the high index of refraction material 322 may be formed from about 2.8 nm thick Molybdenum (Mo) while the low index of refraction material 324 may be formed from about 4.1 nm thick Silicon (Si).

The buffer layer acting as a capping layer may be made of is made of carbon (C), silicon carbide (SiC), silicon (Si), or Ruthenium (Ru). For example, the capping layer of about 2.5 nm thick Ruthenium (Ru) may be formed at the top of the reflective ML coating 320 to prevent oxidation of Molybdenum by exposure to the environment. The Ru capping layer is likely to be oxidized in a step to be carried out during production of a mask or in a step to be carried out at the time of producing a photomask from the mask (such as a cleaning, defect inspection, heating, dry etching or defect correcting step).

FIGS. 4A-E are schematic cross-sectional views at various stages of a method fabricating an EUV mask according to various embodiments of the present disclosure. The method is able to locally repair all types of aforementioned defects, so as to reduce deleterious effects of the defects on the projected pattern in the photoresist according to various embodiments of the present disclosure. For reasons of simplicity, FIGS. 4A-4E may only illustrate a part of the EUV mask.

In FIG. 4A, a substrate 410 with a low defect level and a smooth surface is used as the starting material for the EUV mask 200 in the present disclosure. The substrate 410 has a low coefficient of thermal expansion (CTE). In some embodiments, the substrate 410 is a glass or glass-ceramic material. For example, the substrate 410 may be formed of β-quartz.

Referring to FIG. 4B, a reflective ML coating 420 is formed over the substrate 410. The reflective ML coating 420 has about 30-60 pairs of alternating layers of a high index of refraction material 422 and a low index of refraction material 424. In some embodiments, the reflective ML coating 320 has 40 pairs of the alternative layers 422/424. A high index of refraction material 422 includes elements with high atomic number which tend to scatter EUV light. A low index of refraction material 424 includes elements with low atomic number which tend to transmit EUV light. The reflective ML coating 420 is formed over the substrate 410 by using ion beam deposition (IBD) or DC magnetron sputtering. The thickness uniformity should be better than 0.8% across the substrate 3410. IBD results in less perturbation and fewer defects in the upper surface of the reflective ML coating 420 because the deposition conditions can usually be optimized to smooth over any defect on the substrate 410. In various embodiments, 40 pairs of the alternative layers 422/424 of the ML coating 420 are deposited in which the high index of refraction material 422 may be formed from about 3 nm thick Mo while the low index of refraction material 424 may be formed from about 4 nm thick Si. For example, the high index of refraction material 422 may be formed from about 2.8 nm thick Mo while the low index of refraction material 424 may be formed from about 4.1 nm thick Si.

In various embodiments, in fabricating an RN mask, a substrate 410 may be provided having the reflective ML coating 420 thereon. In this case of the substrate 410 already having the reflective ML coating 420, the operation in FIG. 4B may be omitted in the method of fabricating the EUV mask according to the embodiments of the present disclosure.

As shown in FIG. 4C, a buffer layer 430 is formed over the reflective ML coating 420. The buffer layer 430 may have a thickness of about 20-60 nm. In various embodiments, the buffer layer may a Ru capping layer formed at the top of the ML coating 420 to prevent oxidation of Mo by exposure to the environment. In some embodiments, the buffer layer may be formed from silicon dioxide ($SiO_2$) or a silicon (Si) layer. The buffer layer 430 may be low temperature oxide (LTO) as $SiO_2$, or other materials, such as silicon oxynitride (SiOxNy) or carbon (C). The buffer layer 430 may act later as an etch stop layer for patterning of the overlying absorber layer 440 formed in the following operation. An absorber layer 440 is formed over the buffer layer 430 according to various embodiments of the present disclosure. In embodiments, the absorber layer 440 has a total thickness d raging from 30-70 nm. The absorber layer 340 may be deposited by RF sputtering, DC sputtering, ion beam deposition (IBD) or atomic layer chemical vapor deposition (ALD).

Referring to FIG. 4D, the absorber layer 440 is patterned to be an absorber pattern 442 having features thereon and exposing at least a portion of a top surface of the underlying buffer layer 430, or the reflective ML coating 420 in the absence of the buffer layer 430. Patterning the absorber layer 440 includes forming a photoresist pattern over the absorber layer 440 in an absorption region, etching the absorber layer 440 by using the photoresist pattern as an etch mask to form an absorber pattern, and removing the photoresist pattern. In particular, the absorber layer 440 may be covered with a radiation-sensitive layer, such as photoresist, that is coated, exposed, and developed with a desired pattern. The photoresist pattern has a thickness of about 160-640 nm. As desired, a chemically-amplified resist (CAR) may be used. Depending on the photoresist pattern used, exposure is performed on an electron beam (e-beam) writer or a laser writer. After post-develop measurement of the CD of the features in the photoresist pattern, the pattern is transferred into the absorber pattern 442 as shown in FIG. 4D. Reactive ion etch may be used. For example, an absorber layer 440 may be dry etched with a gas which contains chlorine, such as $Cl_2$ or $BCl_3$, or with a gas which contains fluorine, such as $NF_3$. Argon (Ar) may be used as a carrier gas. In some cases, oxygen ($O_2$) may also be included as carrier. The etch rate and the etch selectivity depend on the etchant gas, etchant flow rate, power, pressure, and substrate temperature. The buffer layer 430 may serve as an etch stop layer to help achieve a good etch profile in the overlying absorber layer 440. The buffer layer 430 protects the underlying reflective ML coating 420 from damage during etch of the absorber layer 440.

Referring to FIG. 4E a columnar reflector 450 is deposited between sidewalls of the absorber pattern 442 by a suitable process. In other words, the columnar reflector 450 is deposited between the features of the absorber pattern 442, as shown in FIG. 3B or 4E. In various embodiments, the columnar reflector 450 is formed by alternatively depositing a first layer of a low index of refraction material, and depositing a second layer of a high index of refraction material for at least one time. In some embodiments, the columnar reflector 450 is formed by alternatively depositing a first layer of a low index of refraction material, depositing a second layer of a low or a high index of refraction material, and depositing a third layer of a high index of refraction material for at least one time. In some embodiments, the high index of refraction material 452 is Mo, $MoO_2$, Cr, W, La, Mg, Ru, or TaBN and a low index of refraction material 454 is Si, TEOS, B4C, $SiO_2$, Y, or SiC. In certain embodiments, the low index of refraction material 454 is TEOS and the high index of the refraction material 452 is Cr. In some embodiments, the bulged part from the reflective ML coating 420 is leveled prior to the formation of the buffer layer 420 and the columnar reflector 450. According to various embodiments, the cross-section area of the columnar reflector is in a Gaussian, rectangle, square, circular, polygonal or curving shape. In some embodiments, the columnar reflector 450 is not in contact with a sidewall of the absorber pattern 442.

Figure 5:
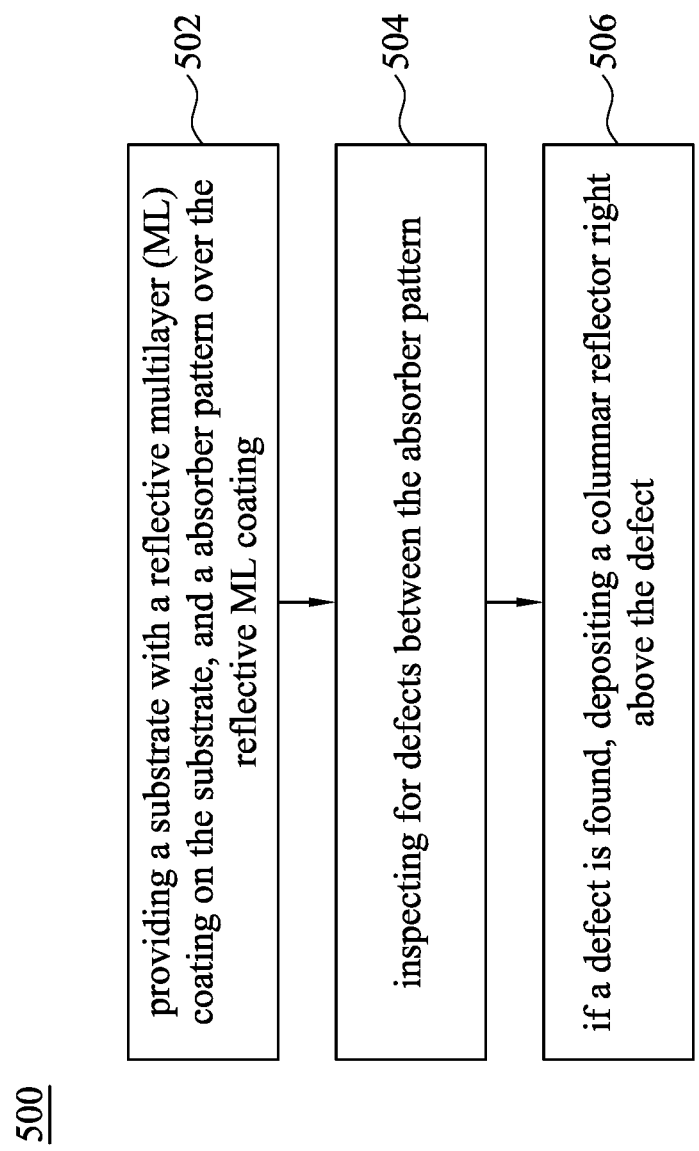
FIG. 5 a flowchart illustrating a method of fabricating an EUV mask according to various embodiments of the present disclosure.

FIG. 5 is a flowchart 500 illustrating a method of fabricating an EUV mask according to various embodiments of the present disclosure. The operations 502-506 are disclosed in association with the cross-sectional side views of a portion of the EUV mask 200 from FIGS. 4A to 4E at various fabrication stages.

In operation 502, a substrate 410 is provided having a reflective ML coating on the substrate and an absorber pattern over the reflective ML coating. Referring to FIG. 4A, the substrate 410 is made of a material having a low coefficient of thermal expansion (CTE). For example, the substrate 410 may be formed of β-quartz.

Still referring to the operation 502, a reflective ML coating 420 is deposited over the substrate 410. In FIG. 4B, the reflective ML coating 420 has about 30-60 pairs of alternating layers of a high index of refraction material 422 and a low index of refraction material 424. In embodiments, the reflective ML coating 420 has 40 pairs of the alternative layers 422/424. As various embodiments, in fabricating an EUV mask, a substrate 410 may be provided having the reflective ML coating 420 thereon. In this case of the substrate 410 already provided with a reflective ML coating 420 on the substrate, a buffer layer 430 (optional) and the absorber pattern 440, the operation 502 in FIG. 5 may refer to the stage of FIG. 4D in the method of fabricating the EUV mask according to the embodiments of the present disclosure.

Referring to operation 504 of FIG. 5, areas between the sidewalls of the absorber pattern (i.e., in the absorber layer 440 and on the top surface of the reflective ML coating 420 or the buffer layer 430) are inspected for defects. In some embodiments, inspecting for the defects on the top surface of the reflective ML coating is conducted by atomic force microscope (AFM) scanning.

Figure 6:
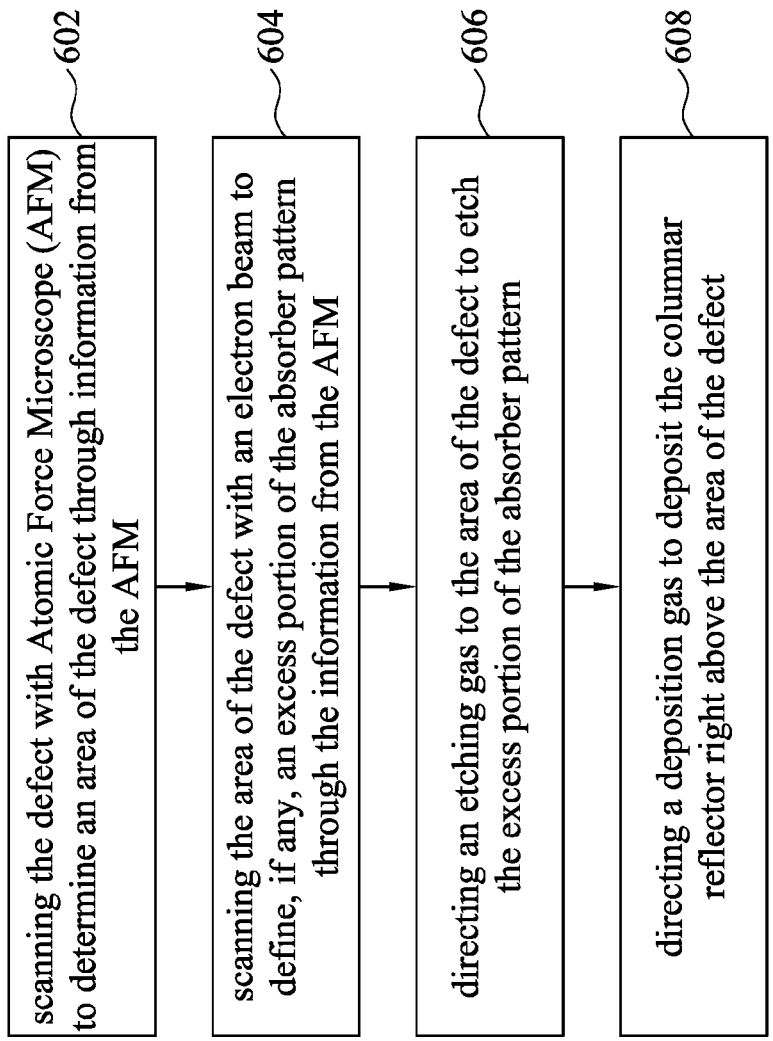
FIG. 6 a flowchart illustrating an operation of depositing a columnar reflector in the method of fabricating an EUV mask according to various embodiments of the present disclosure.

Referring to operation 506 of FIG. 5, if a defect is found, a columnar reflector 450 of FIG. 4E is deposited right above the defect in the absorber layer 440, as shown in FIG. 3B. In various embodiments, the columnar reflector 450 may be deposited through the following operations. Referring to FIG. 6, in operation 602, the defect is scanned with the AFM to determine an area of the defect through information provided from the AFM scanning. For example, the coated substrate may be mounted on a moveable stage in a vacuum chamber of an electron beam (e-beam) system; the area of the defect, which is closed to an e-beam, is positioned by navigating the moveable stage. In operation 604, the area of the defect is scanned with an e-beam to define an excess portion, if any, of the absorber pattern through the information provided from the AFM. For example, the etching gas may be directed concurrently with the e-beam so as to the defect to etch the excess portion. In operation 606, an etching gas is directed to the area of the defect to etch the excess portion of the absorber pattern. For example, the depositing gas may be directed concurrently with the e-beam so as to deposit a columnar reflector right above defect. Further, a deposition gas is directed in operation 608 to deposit the columnar reflector right above the area of the defect. In various embodiments, the cross section of the area of the defect is in Gaussian, rectangle, square, circular, polygonal or curving shape.

Additionally, an feature of the area where the reflector 405 is deposited is compared with the CD error or aerial image to check if the CD error of the feature of the area variation is within −/+10% variation of a layout designed target (i.e. a wafer dimension).

According to various embodiments of the present disclosure, the columnar reflector 450 has a cross-sectional area substantially equal to the defect in the reflective ML coating 420 underneath the columnar reflector 450. In various embodiments, the cross-section area of the columnar reflector 450 is in a Gaussian, rectangle, square, circular, polygonal or curving shape. In some embodiments, the columnar reflector 450 has a gap with and is not in contact with a sidewall of the absorber pattern 440. In specific embodiments, in case the defect is larger than the space between the sidewalls of the absorber pattern between which the columnar reflector 450 can be deposited, the patterned absorber layer 440 may need to be trimmed to fully expose the defect from the top surface of the reflective ML coating 420 or the buffer layer 430. Trimming of the patterned absorber layer 440 leaves sufficient space for depositing the columnar reflector 450 without contacting the sidewall of the patterned absorber layer 440. In various embodiments, depositing the columnar reflector is conducted with suitable process such as an e-beam, ion-beam or laser-beam process. Trimming the absorber pattern may also be conducted with the e-beam, ion-beam or laser-beam process.

In order to compensate the EUV phase defect, a columnar reflector, which acts as a Bragg reflector, is deposited according to various embodiments to locally compensate and repair the EUV phase defect. According to the embodiments of the present disclosure, the reflective loss due to the EUV phase defect can be compensated and recover the phase different due to the EUV phase defect, so as to form a desirable wafer printed image.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An extreme ultraviolet (EUV) mask, comprising:
a substrate,
a reflective multiplayer (ML) coating on the substrate; and
an absorber layer over the reflective ML coating,
wherein the absorber layer comprises a columnar reflector.

2. The EUV mask of claim 1, wherein the columnar reflector has a planar, curving, or V-shape top surface.

3. The EUV mask of claim 1, wherein the columnar reflector has a sidewall not in contact with the absorber layer.

4. The EUV mask of claim 1, wherein the columnar reflector is directly on the reflective ML coating.

5. The EUV mask of claim 1, wherein the stack of the columnar comprises alternating layers.

6. The EUV mask of claim 5, wherein the columnar reflector comprises at least one stack of alternating layers of a low index of refraction material and a high index of refraction material.

7. The EUV mask of claim 6, wherein the low index of the refractive material is Si, TEOS, B4C, $SiO_2$, Y, or SiC, and the high index of the refractive material is Mo, $MoO_2$, Cr, W, La, Mg, Ru, or TaBN.

8. The EUV mask of claim 5, the columnar reflector comprises three layers of two low index of refraction materials and one high index of refraction material or one low index of refraction material and two high index of refraction materials.

9. The EUV mask of claim 8, wherein the low index of the refractive material is Si, TEOS, B4C, $SiO_2$, Y, or SiC, and the high index of the refractive material is Mo, $MoO_2$, Cr, W, La, Mg, Ru, or TaBN.

10. The EUV mask of claim 5, wherein the stack of the columnar reflector is made of alternating layers of TEOS and Cr.

11. The EUV mask of claim 1, further comprising a buffer layer as a capping layer between the absorber layer and the reflective ML coating.

12. The EUV mask of claim 11, wherein the buffer layer is made of carbon (C), silicon carbide (SiC), silicon (Si), or Ruthenium (Ru).

13. The EUV mask of claim 1, wherein the columnar reflector has a thickness in a range of 7-10 nm.

14. The EUV mask of claim 1, wherein the absorber layer has a pattern.

15. The EUV mask of claim 14, wherein the columnar reflector is between two sidewalls of the pattern.

16. A method of manufacturing an extreme ultraviolet (EUV) mask, the method comprising:
providing a substrate with a reflective multilayer (ML) coating on the substrate;
depositing a absorber layer over the reflective ML coating;
patterning the absorber layer to form a gap in the absorber layer; and
depositing a columnar reflector comprising a stack of alternating layers of different index of refraction materials in the gap of the absorber layer.

17. The method of manufacturing the EUV mask of claim 16, wherein depositing the columnar reflector comprises:
detecting a defect in the reflective or the substrate through the gap;
forming the columnar reflector in the gap if the defect is found, depositing a columnar reflector right above the defect.

18. The method of manufacturing the EUV mask of claim 17, wherein detecting the defect in the reflective or the substrate through the gap comprises:
scanning the defect through the gap to determine an area of the defect, if any;
applying the absorber layer with an electron beam to define an excess portion of the gap in the absorber layer;
directing an etching gas to the area of the defect to etch the excess portion of the gap; and
directing a deposition gas to deposit the columnar reflector in the gap and right above the area of the defect.

19. The method of manufacturing the EUV mask of claim 16, wherein depositing the columnar reflector is performed by alternatively depositing a first layer of a low index of refraction material, and depositing a second layer of a high index of refraction material for at least one time, or wherein depositing the columnar reflector is performed by alternatively depositing a first layer of a low index of refraction material, depositing a second layer of a low or a high index of refraction material, and depositing a third layer of a high index of refraction material for at least one time.

20. The method of manufacturing the EUV mask of claim 16, further comprising trimming the absorber layer to fully expose the defect from the top surface of the reflective ML coating before depositing a columnar reflector right above the defect.

* * * * *